United States Patent
Yin et al.

(10) Patent No.: US 8,384,162 B2
(45) Date of Patent: Feb. 26, 2013

(54) DEVICE HAVING ADJUSTABLE CHANNEL STRESS AND METHOD THEREOF

(75) Inventors: Huaxiang Yin, Beijing (CN); Qiuxia Xu, Beijing (CN); Dapeng Chen, Beijing (CH)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/108,742

(22) Filed: May 16, 2011

(65) Prior Publication Data

US 2012/0139054 A1  Jun. 7, 2012

Related U.S. Application Data

(63) Continuation of application No. PCT/CN2011/000278, filed on Feb. 23, 2011.

(30) Foreign Application Priority Data

Dec. 6, 2010 (CN) .......................... 2010 1 0586003

(51) Int. Cl.
*H01L 27/092* (2006.01)
(52) U.S. Cl. ............... 257/369; 257/288; 257/E29.255; 257/E21.409; 257/E27.062; 438/197; 438/199
(58) Field of Classification Search .................. 257/369, 257/288, E29.255, E21.409, E21.635, E27.062; 438/197, 199
See application file for complete search history.

(56) References Cited

U.S. PATENT DOCUMENTS

| | | | | |
|---|---|---|---|---|
| 5,877,530 | A | 3/1999 | Aronowitz et al. | 257/344 |
| 6,455,383 | B1 * | 9/2002 | Wu | 438/296 |
| 7,329,571 | B2 * | 2/2008 | Hoentschel et al. | 438/199 |
| 7,675,055 | B2 * | 3/2010 | Ieong et al. | 257/19 |
| 7,939,895 | B2 * | 5/2011 | Fukasaku | 257/369 |
| 2005/0093059 | A1 * | 5/2005 | Belyansky et al. | 257/327 |
| 2006/0011984 | A1 * | 1/2006 | Currie | 257/352 |
| 2009/0173967 | A1 * | 7/2009 | Hamaguchi et al. | 257/190 |

FOREIGN PATENT DOCUMENTS

| | | |
|---|---|---|
| CN | 1902740 A | 1/2007 |
| TW | 519761 B | 1/2003 |

* cited by examiner

*Primary Examiner* — Thinh T Nguyen
(74) *Attorney, Agent, or Firm* — Martine Penilla Group, LLP

(57) ABSTRACT

The present invention relates to a device having adjustable channel stress and method thereof. There is provided an MOS device (200, 300), comprising a semiconductor substrate (202, 302); a channel formed on the semiconductor substrate (202, 302); a gate dielectric layer (204, 304) formed on the channel; a gate conductor (206, 306) formed on the gate dielectric layer (204, 304); and a source and a drain formed on both sides of the gate; wherein the gate conductor (206, 306) has a shape for producing a first stress to be applied to the channel so as to adjust the mobility of carriers in the channel. In the present invention, the shape of the gate conductor may be adjusted by controlling the etching process parameter, thus the stress in the channel may be adjusted conveniently, meanwhile, it may be used in combination with other mechanisms that generate stresses to obtain the desired channel stress.

11 Claims, 5 Drawing Sheets

US 8,384,162 B2

DEVICE HAVING ADJUSTABLE CHANNEL STRESS AND METHOD THEREOF

CLAIM OF PRIORITY

This application claims priority under 35 U.S.C. §§120 and 365(c) as a continuation application of prior International Application No. PCT/CN2011/000278, filed Feb. 23, 2011, and which was not published in English under PCT Article 21(2). The PCT/CN2011/000278 application in turn claims priority to Chinese Application No. CN 2010105486003.X, filed on Dec. 6, 2010. The disclosures of the prior international application and Chinese application are incorporated herein by reference.

FIELD OF THE INVENTION

The present invention relates to a semiconductor device and a method for manufacturing the same, particularly to a device having adjustable channel stress and method thereof.

BACKGROUND OF THE INVENTION

It has been approved by both theory and empirical studies that when a stress is applied to the channel of a transistor, the carrier mobility of the transistor will be enhanced or reduced; however, it is also known that electrons and holes may have different responses to the same type of stress. For example, application of compressive stress in a longitudinal direction of flow of electrical current is advantageous to hole mobility, but is not advantageous to electron mobility, and application of tensile stress in a longitudinal direction is advantageous to electron mobility, but is not advantageous to hole mobility. With continuous reduction in the device feature size, stress channel engineering for the purpose of enhancing the channel carrier mobility plays a more and more important role. Multiple uniaxial process induced stresses are integrated to a device process. In terms of the optimal introducing direction of the uniaxial process induced stress, as for an NMOS device, introduction of tensile stress in a direction along the channel, that is, direction X as well as introduction of compressive stress in a direction perpendicular to the channel direction, that is, direction Z are most effective for enhancing the mobility of electrons in the channel, as shown in FIG. 1; on the other hand, as for a PMOS device, introduction of compressive stress in a direction X is most effective for enhancing the mobility of holes in the channel. A lot of methods have been developed based on this theory. One of the methods is to produce "global stress", that is, the stress being applied to the overall transistor device area produced from the substrate. The global stress is produced by using the structures such as SiGe stress relaxed buffer layer, SiC stress relaxed buffer layer or SiGe structure on an insulator. Another method is to produce "local stress", that is, the stress being merely applied from the local structure to the local area adjacent to the channel. The local stress is produced by using the structures such as shallow trench isolation structure that produces a stress, (dual) stress liner, SiGe (e-SiGe) structure embedded into source/drain (S/D) area of a PMOS, Σ-shaped SiGe (e-SiGe) structure embedded into source/drain (S/D) area of a PMOS, and SiC (e-SiC) structure embedded into the source/drain (S/D) area of an NMOS. However, among the above methods for changing the stress in a channel, some require a complicated process, and some may introduce defects to the channel. On the other hand, with continuous reduction in the device feature size, the induced stress effect brought forward by the above method is continuously weakened.

In view of the above reason, there still exists a need for providing a semiconductor structure which is capable of realizing adjustable channel stress for both NMOS and PMOS devices.

SUMMARY OF THE INVENTION

To achieve the above object, in a first aspect of the invention, there is provided an MOS device, comprising: a semiconductor substrate; a channel formed on the semiconductor substrate; a gate dielectric layer formed on the channel; a gate conductor formed on the gate dielectric layer; and a source and a drain formed on both sides of the gate; wherein the gate conductor has a shape for producing a first stress to be applied to the channel so as to adjust the mobility of carriers in the channel.

In a second aspect of the present invention, there is provided a method for manufacturing an MOS device, comprising: providing a semiconductor substrate; forming a channel on the semiconductor substrate; forming a dielectric layer on the channel; forming a gate conductor on the dielectric layer; and forming a source and a drain on both sides of the gate; wherein the shape of the gate conductor is changed by an etching process to adjust the stress in the channel, so as to adjust the mobility of carriers in the channel.

In a third aspect of the present invention, there is provided a CMOS device, comprising: a first type of transistor and a second type of transistor which is complementary thereto, wherein the first type of transistor and the second type of transistor respectively comprise the MOS device in the first aspect of the present invention.

In a fourth aspect of the present invention, there is provided a method for manufacturing a CMOS device, comprising: forming a first type of transistor and a second type of transistor which is complementary thereto, wherein forming the first type of transistor and the second type of transistor respectively comprises performing the step in the second aspect of the present invention.

BRIEF DESCRIPTION OF THE DRAWINGS

To understand the present invention well and to show how it is effected, the accompanying drawings will now be referenced through the embodiments, wherein.

DETAILED DESCRIPTION OF THE INVENTION

One or more aspects of the embodiments of the present invention will described by referring to the accompanying drawings below, where identical elements will be generally indicated by identical reference signs throughout the drawings. In the following descriptions, many specific details are elaborated for the purpose of explanation so as to facilitate thorough understanding of one or more aspects of the embodiments of the present invention. However, it may be apparent to those skilled in the art that they may use few of these specific details to implement one or more aspects of the embodiments of the present invention.

In addition, although the specific features or aspects of an embodiment are merely disclosed by one of the implementing modes, such specific features or aspects may be incorporated with one or more other features or aspects of other implementing modes that may be advantageous to and desired by any given or specific application.

First Embodiment

Figure 1:
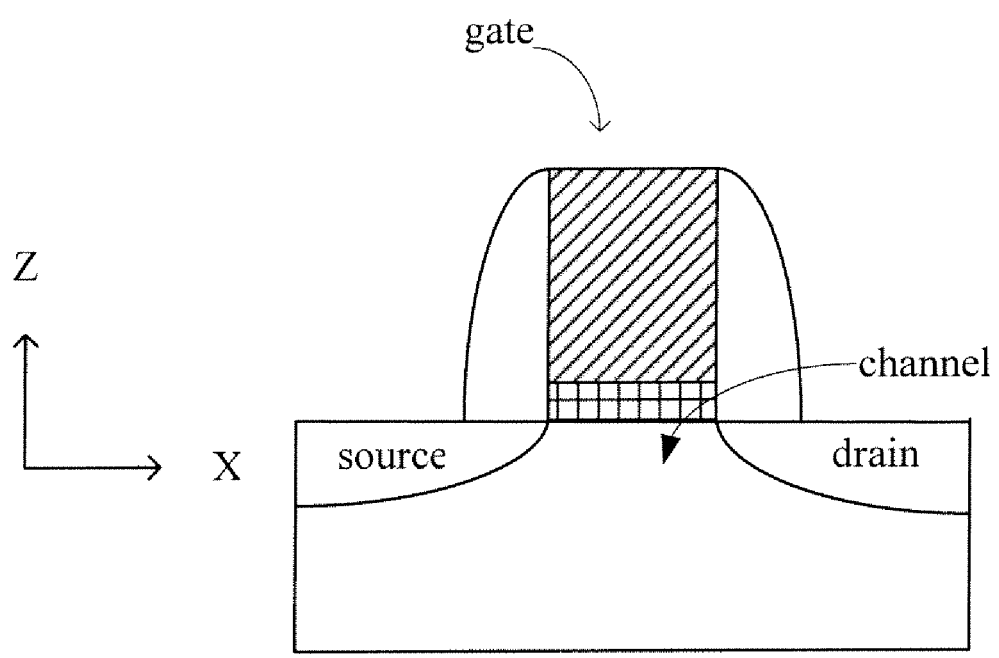
FIG. 1 is a schematic diagram illustrating an optimal introducing direction for inducing a stress to a channel using a uniaxial process.
Figure 2A:
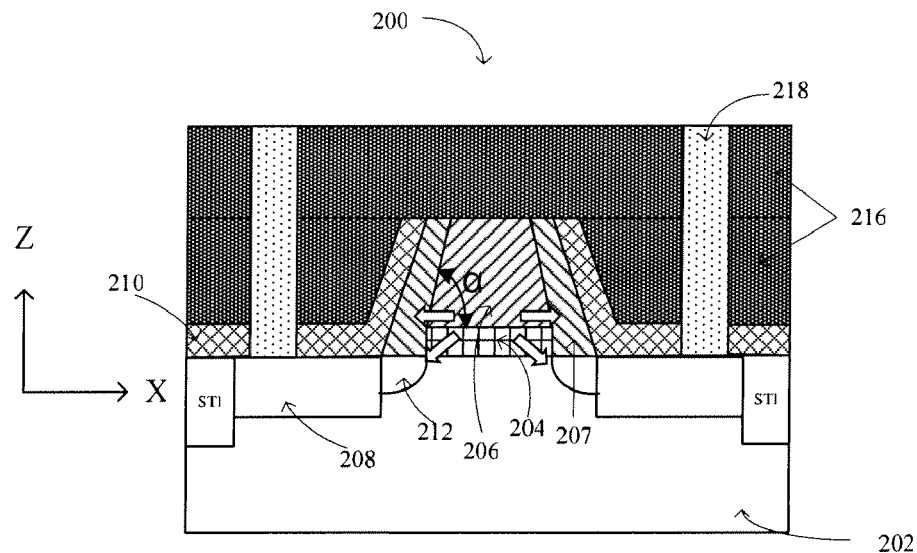
FIG. 2a is a schematic diagram illustrating an NMOS device according to an embodiment of the present invention.
Figure 2B:
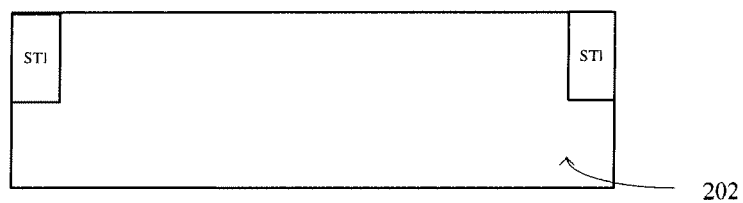
FIGS. 2b-h illustrate the steps for manufacturing an NMOS device according to an embodiment of the present invention.

In this embodiment, an NMOS 200 as shown in FIG. 2a is provided, the formation may include providing a semiconductor substrate 202, as shown in FIG. 2b, the semiconductor substrate may be of any type known in the field of electronics, such as bulk semiconductor, Semiconductor-On-Insulator (SOI). Furthermore, the semiconductor substrate may be strained, non-strained, or may comprise therein a strain zone or a non-strain zone. When a semiconductor substrate is provided, isolation areas such as Shallow Trench Isolation (STI) area or Field Isolation area made of materials with or without stress are formed in the semiconductor substrate 202 by using the traditional technology commonly known in the art.

Figure 2C:
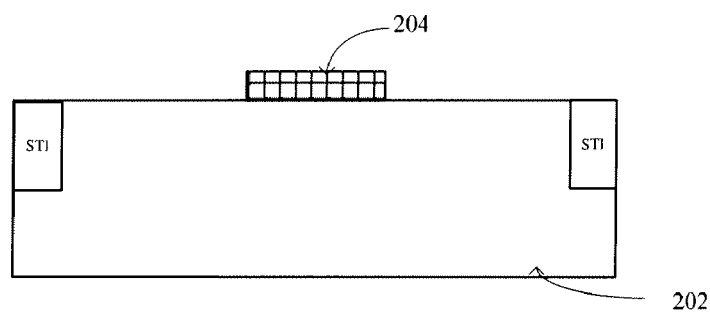

A gate dielectric layer 204 is formed on the semiconductor substrate in the active region between the isolation areas, as shown in FIG. 2c, the materials of the gate dielectric layer 204 may include high-K dielectric constant material or low-K dielectric constant material, such as $SiO_2$, SiON, $ZrO_2$, $HfO_2$, $Al_2O_3$, HfSiO, HfAlO, HfSiON, HfAlSiO, HfTaSiO and/or combination thereof, and/or multi-layer structures thereof. The gate dielectric layer 204 may be formed by thermal growth processes such as oxidation, nitridation, or oxynitridation. As an alternative, the gate dielectric layer may be formed by deposition processes such as Chemical Vapor Deposition (CVD), plasma-assisted CVD, Atomic Layer Deposition (ALD), evaporation, reactive sputtering, chemical solution deposition or other similar deposition processes, and the gate dielectric layer 204 may also be formed by the combination of any of the above processes.

Figure 2D:
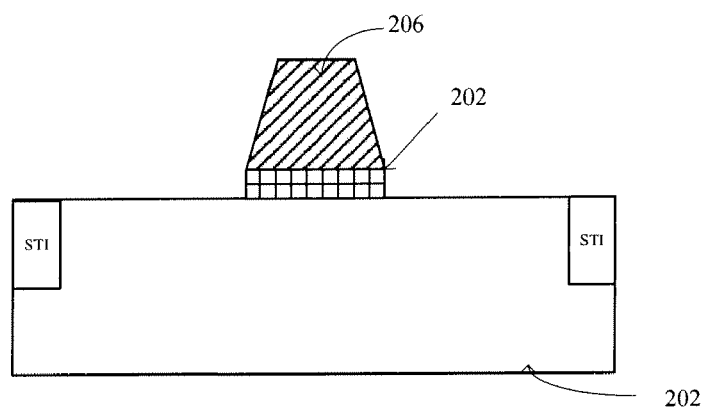
Figure 2E:
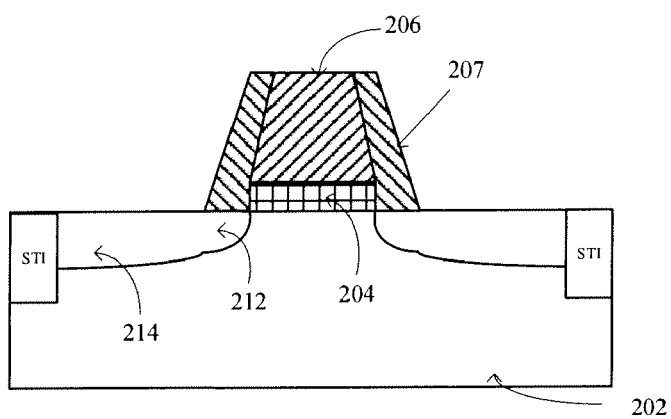
Figure 2F:
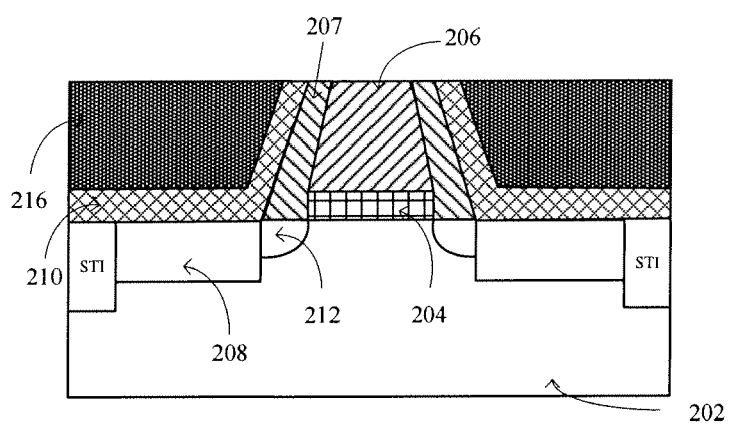
Figure 2G:
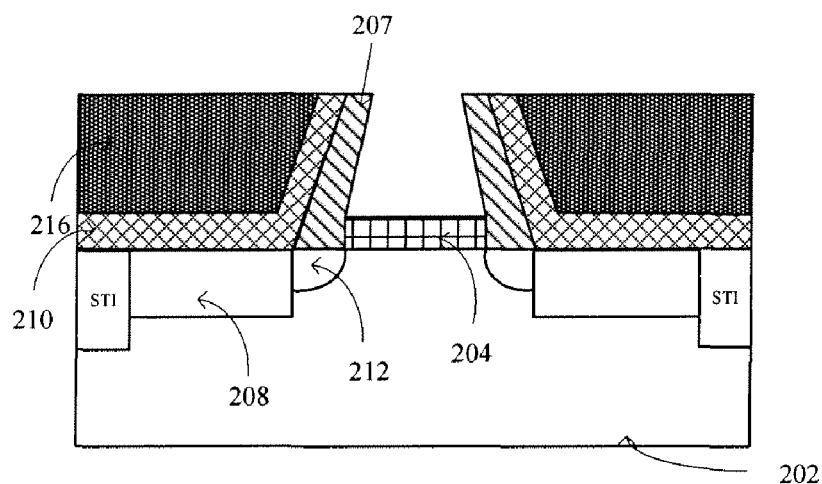
Figure 2H:
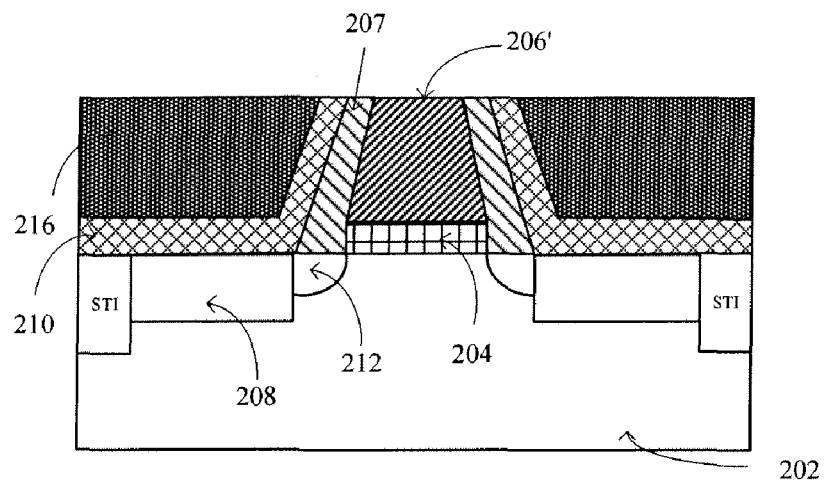

When a gate dielectric layer 204 is formed, a regular trapezoid gate conductor 206 is formed on the gate dielectric layer 204, as shown in FIG. 2d, the gate conductor may include the conductive materials of any type, which include but are not limited to polysilicon, metal or metal alloy, silicide, conductive Nitride, poly-SiGe and their combinations. Wherein, specifically, as for the manufacturing process of a traditional MOS device or the gate-first process for the high-K dielectrics/metal gate, for example, a deposition process is used to form a gate conductor layer on the gate dielectric layer 204, then a method of selective etching is used to form a regular trapezoid gate conductor structure with an angle α between its side and bottom being less than 90°, preferably 45°<α<90°. The selective etching, for example, uses a method of Reactive Ion Etching (RIE) in a plasma cavity, the commonly used etching gases include two of F-based and Cl-based chemical etching compositions. Under cooperation of lower power and higher pressure, pure F-based and Cl-based gases mainly behave as isotropic selective etching. Taking Cl-based gases as an example below, and F-based gases are based on similar principles. Isotropic selective etching may be realized by adding halide gases such as HBr into $Cl_2$. The common vertical polysilicon gate etching comprises two steps of main etching $Cl_2$+HBr and over etching $Cl_2$+HBr+$O_2$, the throughput of reactive polymer may be decreased by adding $O_2$ into the over etching, so as to increase the isotropy degree, finally the side steepness of the Cl-based etched silicon trench is increased to realize anisotropic etching of an angle approximate to 90°. While in the steps of forming a regular trapezoid gate conductor structure of the present invention, the throughput of the reactive polymer of the anisotropic etching may be controlled by adjusting the relative time proportion of main etching and over etching or adjusting the content, power and pressure of different gases in the respective steps, thus the angle α between the side and bottom of the regular trapezoid may be controlled, the larger the throughput is, the smaller the angle α is. For example, when an American LAM 4420 etcher is used, with the main etching pressure of 150-250 mtor, RF power of 250-300 W, $Cl_2$ of 50-150 sccm, HBr of 10-30 sccm; the over etch pressure of 250-350 mtor, RF power of 260-300 W, $Cl_2$ of 50-150 sccm, HBr of 10-30 sccm+He of 30-70 sccm, $O_2$ of 5-10 sccm and with the proportion between the main etching time and over etching time<1:0.8, a regular trapezoid gate shape is formed with an angle α between its side and bottom being less than 90°. Particularly, when the proportion between the main etching time and the over etching time is 1:0.05, the polysilicon electrode angle approximates to 45°; when the proportion between the main etching time and the over etching time is 1:0.2, the polysilicon electrode angle is about 75°; when the time proportion is 1:0.5, the polysilicon electrode angle is 85°; when the time proportion is 1:0.8, the angle approximates to 90°. Then, through other common steps, for example, forming a source/drain extension 212 in the source/drain area, forming a source and drain 214 (as shown in FIG. 2e), forming an Interlayer Dielectric Layer (ILD) 216 on the top surface of the source and gate for contact (as shown in FIG. 2f), forming a metal contact 218, thereby forming the device as shown in FIG. 2a. As for the gate-last process for the high-K dielectrics/metal gate, on the basis of the formation of the regular trapezoid polysilicon gate conductor structure as stated above, upon formation of the source/drain extension and the source and drain described later (that is, on the basis of FIG. 2f), the gate conductor is removed, as shown in FIG. 2g, the gate dielectric layer 204 under the gate conductor may remain intact or substantially intact. However, the embodiments of the present invention are not limited to this, for example, according to some embodiments, the exposed part of the gate dielectric layer 204 due to removal of the gate conductor may also be selectively removed, to thereby expose the channel region below. In such a case, re-growth of the gate dielectric layer 204 is needed in the open gate region. Then, for example, a deposition process is used to deposit a gate metal 206', as shown in FIG. 2h. Later, a metal contact 218 is formed, to thereby form the device as shown in FIG. 2a. In any case, in order not to vague the essence of the present invention, those skilled in the art may refer to other documents and patents to know the details of these steps. Since the vacancy after removing the polysilicon is of a regular trapezoid shape, the formed metal gate is still of a regular trapezoid shape. Normally, in the art, the gate structure is often manufactured into a shape to be nearly vertical, but no remarkable stress can be applied to the channel this time. However, it is found by the inventor that the regular trapezoid gate can apply stresses to the channel in directions as indicated by the hollow arrows in FIG. 2a, that is, introducing tensile stress in a direction along the channel, i.e., direction X and introducing compressive stress in a direction perpendicular to the channel direction, i.e., direction Z, thus the mobility of electrons in the channel is enhanced. Meanwhile, since the shape of the gate structure may be changed by controlling the process parameter simply, that is, controlling the angle α, the degree of the channel strain may be controlled easily, greater process flexibility and simple process complexity are possessed with no additional process cost.

Alternatively, stress sidewalls 207 may be formed on both sides of the gate conductor, such stress sidewalls 207 may be formed from either single-layer thin film (single process) or multi-layer thin film (multiple processes), such as $SiO_2$, Silicon Nitride, $SiO_2$/Silicon Nitride, the multi-layer structure of shift $SiO_2$ or Silicon Nitride and the conventional $SiO_2$ or Silicon Nitride, and the multi-layer structure of shift $SiO_2$ or Silicon Nitride and a first conventional $SiO_2$ or Nitride and a second conventional $SiO_2$ or Silicon Nitride and so on.

Alternatively, a stress source 208, including the embedded SiC or the stress source of any type formed by any further techniques, may be embedded into source and drain areas adjacent to the gate conductor.

Alternatively, a stress liner 210 may be formed on the top of NMOS 200, and the stress liner may apply a stress to the channel region under the gate conductor. Wherein the stress liner is formed on the top of the NMOS by deposition, for example, in a Plasma Enhanced Chemical Vapor Deposition (PECVD), but the stress liner may also be formed by other common methods except for PECVD. The stress liner may be nitride or oxide liner. However, it should be understood by those skilled in the art that the stress liner is not limited to nitride or oxide liner, other stress liner materials may also be used.

In a case where the NMOS device comprises the above stress sidewalls 207, embedded stress source 208 or stress liner 210, if the above gate is in a shape of a regular trapezoid with an angle $\alpha<90°$, the stress sidewalls 207, embedded stress source 208 or stress liner 210 may either be tensile or be compressive, so long as the sum of the stress applied by the regular trapezoid gate conductor to the channel and the stress applied by the stress sidewalls, stress source, and stress liner to the channel makes the stress in the channel of the NMOS device be the tensile stress. However, in a case where at least one of the stress sidewalls 207, embedded stress source 208 or stress liner 210 is a tensile stress source, the gate is not limited to a structure such as a regular trapezoid that is made to generate an enhanced tensile stress to the channel, it can even be an inverted trapezoid gate with $\alpha>90°$, only the gate then generates compressive stress to the channel (the details are given below), but one or all of the stress sidewalls 207, embedded stress source 208 or stress liner 210 may generate tensile stress to the channel, so long as the total effect of the sum of the stress applied by the inverted trapezoid gate conductor to the channel and the stress applied by the stress sidewalls, stress source, and stress liner to the channel makes the stress in the channel of the NMOS device be the tensile stress, the result is that the carrier mobility of the NMOS device is still enhanced. An inverted trapezoid gate shape with $\alpha>90°$ is formed by the following step, on the basis of a common vertical etching, as the etching proceeds, the lateral quantity of etch (the laterally etched thickness) of isotropic etching is gradually increased by gradually increasing gas flow, increasing atmospheric pressure, and decreasing power. For example, by means of the pressure of 350-500 mtor and $Cl_2$ of 150-300 sccm+$O_2$ of 10-30 sccm, the angle $\alpha$ between the side and bottom of the inverted trapezoid approximates 135°.

In addition, through this embodiment, it can be easily thought of by those skilled in the art that the shape of the gate is not limited to a regular trapezoid or an inverted trapezoid, but includes other shapes that can make the stress in the channel change, for example, the shape whose sides are not linear but have certain curvature (inward curving or outward curving).

In conclusion, the shape of the gate conductor may be adjusted by controlling the etching process parameter, thus the stress in the NMOS channel may be adjusted conveniently, meanwhile it may be used in combination with other mechanisms that generate stresses to obtain the desired channel stress.

Second Embodiment

Figure 3:
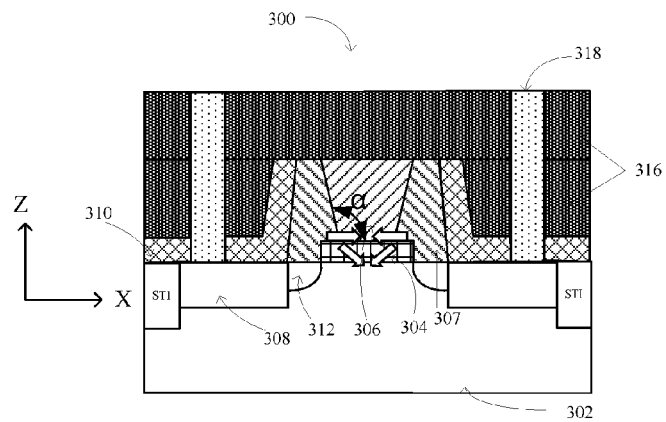
FIG. 3 is a schematic diagram illustrating a PMOS device according to another embodiment of the present invention.

In this embodiment, a PMOS 300 as shown in FIG. 3 is provided, the steps of forming it are similar to the steps of forming the NMOS, which are illustrated by literal descriptions but without figures. The formation may include providing a semiconductor substrate 302, the semiconductor substrate may be of any type known in the field of electronics, such as bulk semiconductor, Semiconductor-On-Insulator (SOI). Furthermore, the semiconductor substrate may be strained, non-strained, or may comprise therein a strain zone or a non-strain zone. When a semiconductor substrate is provided, isolation areas such as Shallow Trench Isolation (STI) area or Field Isolation area made of materials with or without stress are formed in the semiconductor substrate 302 by using the traditional technology commonly known in the art.

A gate dielectric layer 304 is formed on the semiconductor substrate in the active region between the isolation areas. The materials of the gate dielectric layer 304 may include high-K dielectric constant material or low-K dielectric constant, such as $SiO_2$, SiON, $ZrO_2$, $HfO_2$, $Al_2O_3$, HfSiO, HfAlO, HfSiON, HfAlSiO, HfTaSiO and/or combination thereof, and/or multi-layer structures thereof. The gate dielectric layer 304 may be formed by thermal growth processes such as oxidation, nitridation, or oxynitridation. As an alternative, the gate dielectric layer may be formed by deposition processes such as Chemical Vapor Deposition (CVD), plasma-assisted CVD, Atomic Layer Deposition (ALD), evaporation, reactive sputtering, chemical solution deposition or other similar deposition processes, and the gate dielectric layer 304 may also be formed by the combination of any of the above processes.

When a gate dielectric layer 304 is formed, an inverted trapezoid gate conductor 306 is formed on the gate dielectric layer 304, the gate conductor may include the conductive materials of any type, which include but are not limited to polysilicon, metal or metal alloy, silicide, conductive Nitride, poly-SiGe and their combinations. Wherein, specifically, as for the manufacturing process of a traditional MOS device or the gate-first process for the high-K dielectrics/metal gate, for example, a deposition process is used to form a gate conductor layer on the gate dielectric layer 304, then a method of selective etching is used to form an inverted trapezoid gate conductor structure with an angle $\alpha$ between its side and bottom being larger than 90°, preferably $90°<\alpha<135°$. Then, through other common steps, for example, forming a source/drain extension 312 in the source/drain area, forming a source and drain 314, forming an Interlayer Dielectric Layer (ILD) 316 on the top surface of the source and gate for contact, forming a metal contact 318, thereby forming the device as shown in FIG. 3. As for the gate-last process for the high-K dielectrics/metal gate, on the basis of the formation of the inverted trapezoid polysilicon gate conductor structure as stated above, upon formation of the source/drain extension and the source and drain described later, the gate conductor is removed, the gate dielectric layer 304 under the gate conductor may remain intact or substantially intact. However, the embodiments of the present invention are not limited to this, for example, according to some embodiments, the exposed part of the gate dielectric layer 304 due to removal of the gate conductor may also be selectively removed, to thereby expose the channel region below. In such a case, re-growth of the gate dielectric layer 304 is needed in the open gate region. Then, for example, a deposition process is used to deposit a gate metal. Later, a metal contact 318 is formed, to thereby form the device as shown in FIG. 3. Since the vacancy after removing the polysilicon is of an inverted trapezoid shape, the formed metal gate is still of an inverted trapezoid shape. Normally, in the art, the gate structure is often manufactured into a shape to be nearly vertical, but no remarkable stress can be applied to the channel this time. However, it is found by the inventor that the inverted trapezoid gate can apply stresses to the channel in directions as indicated by the hollow arrows in FIG. 3, that is, introducing compressive stress in a direction along the channel, i.e., direction X and introducing compressive stress in a direction perpendicular to the channel direction, i.e., direction Z, note that although the compressive stress introduced in direction Z here is not desirable, the compressive stress introduced in direction X is far greater than that introduced in direction Z, thus the mobility of holes in the channel is still generally enhanced. Meanwhile, since the shape of the gate structure may be changed by controlling the process parameter simply, that is, controlling the angle $\alpha$, the degree of the channel strain may be controlled easily, greater process flexibility and simple process complexity are possessed with no additional process cost.

Alternatively, stress sidewalls 307 may be formed on both sides of the gate conductor, stress sidewalls 307 may be formed from either single-layer thin film (single process) or multi-layer thin film (multiple processes), such as $SiO_2$, Silicon Nitride, $SiO_2$/Silicon Nitride, the multi-layer structure of shift $SiO_2$ or Silicon Nitride and the conventional $SiO_2$ or Silicon Nitride, and the multi-layer structure of shift $SiO_2$ or Silicon Nitride and a first conventional $SiO_2$ or Nitride and a second conventional $SiO_2$ or Silicon Nitride and so on.

Alternatively, a stress source 308, including the embedded SiGe or the stress source of any type formed by any further techniques, may be embedded into source and drain areas adjacent to the gate conductor.

Alternatively, a stress liner 310 may be formed on the top of PMOS 300, and the stress liner may apply a stress to the channel region under the gate conductor. Wherein the stress liner is formed on the top of the PMOS by deposition, for example, in a Plasma Enhanced Chemical Vapor Deposition (PECVD), but the stress liner may also be formed by other common methods except for PECVD. The stress liner may be nitride or oxide liner. However, it should be understood by those skilled in the art that the compressive stress liner is not limited to nitride or oxide liner, other stress liner materials may also be used.

In a case where the PMOS device comprises the above stress sidewalls 307, embedded stress source 308 or stress liner 310, if the above gate is in a shape of an inverted trapezoid with an angle $\alpha$>90°, the stress sidewalls 307, embedded stress source 308 or stress liner 310 may either be tensile or be compressive, so long as the sum of the stress applied by the inverted trapezoid gate conductor to the channel and the stress applied by the stress sidewalls, stress source, and stress liner to the channel makes the stress in the channel of the PMOS device be the tensile stress. However, in a case where at least one of the stress sidewalls 307, embedded stress source 308 or stress liner 310 is a compressive stress source, the gate is not limited to a structure such as an inverted trapezoid that is made to generate an enhanced compressive stress to the channel, it can even be a regular trapezoid gate with $\alpha$<90°, only the gate then generates tensile stress to the channel (as stated in embodiment 1), but one or all of the stress sidewalls 307, embedded stress source 308 or stress liner 310 may generate compressive stress to the channel, so long as the total effect of the sum of the stress applied by the regular trapezoid gate conductor to the channel and the stress applied by the stress sidewalls, stress source, and stress liner to the channel makes the stress in the channel of the PMOS device be the compressive stress, the result is that the carrier mobility of the PMOS device is still enhanced.

In addition, through this embodiment, it can be easily thought of by those skilled in the art that the shape of the gate is not limited to a regular trapezoid or an inverted trapezoid, but includes other shapes that can make the stress in the channel change, for example, the shape whose sides are not linear but have certain curvature (inward curving or outward curving).

The above gate shapes may be formed by using the selective etching as stated in embodiment 1, and no more details will be provided here.

In conclusion, the shape of the gate conductor may be adjusted by controlling the etching process parameter, thus the stress in the PMOS channel may be adjusted conveniently, meanwhile it may be used in combination with other mechanisms that generate stresses to obtain the desired channel stress.

Third Embodiment

Figure 4:
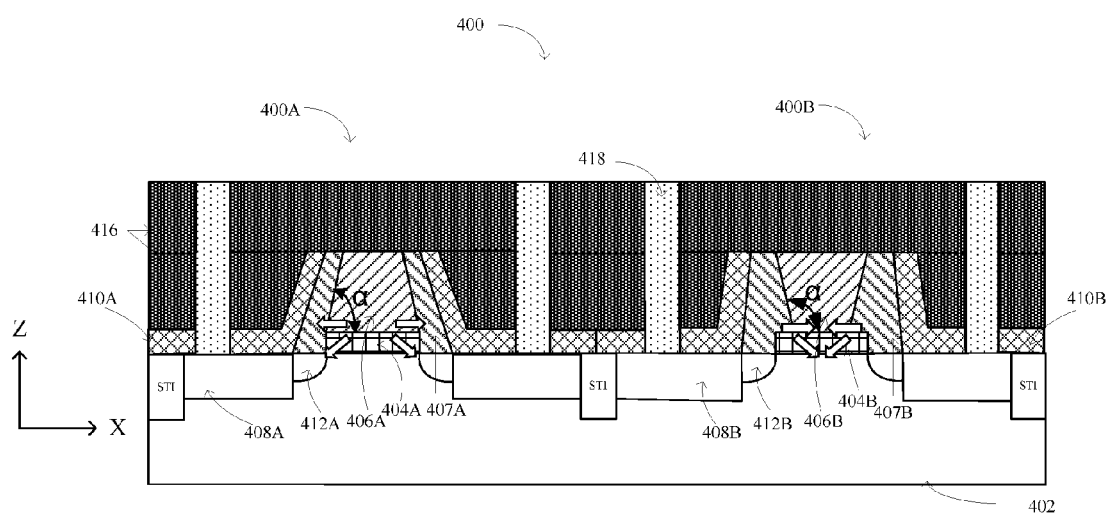
FIG. 4 is a schematic diagram illustrating a CMOS device according to another embodiment of the present invention.

As for a CMOS 400, as shown in FIG. 4, it includes an NMOS 400A and a PMOS 400B, the formation may include providing a semiconductor substrate 402, the semiconductor substrate may be of any type known in the field of electronics, such as bulk semiconductor, Semiconductor-On-Insulator (SOI). Furthermore, the semiconductor substrate may be strained, non-strained, or may comprise therein a strain zone or a non-strain zone. When a semiconductor substrate is provided, isolation areas such as Shallow Trench Isolation (STI) area or Field Isolation area made of materials with or without stress are formed in the semiconductor substrate 402 by using the traditional technology commonly known in the art.

An NMOS active region and a PMOS active region are formed on the semiconductor substrate, and an isolation area is disposed therebetween to separate them. Gate dielectric layers 404A and 404B are formed on the NMOS active region and the PMOS active region, respectively. The materials of the gate dielectric layers 404A and 404B may include high-K dielectric constant material or low-K dielectric constant, such as $SiO_2$, SiON, $ZrO_2$, $HfO_2$, $Al_2O_3$, HfSiO, HfAlO, HfSiON, HfAlSiO, HfTaSiO and/or combination thereof, and/or multi-layer structures thereof. The materials of the gate dielectric layers 404A and 404B may either be the same or not the same, preferably the materials are the same. Said gate dielectric layers may be formed by thermal growth processes such as oxidation, nitridation, or oxynitridation. As an alternative, the gate dielectric layers may be formed by deposition processes such as Chemical Vapor Deposition (CVD), plasma-assisted CVD, Atomic Layer Deposition (ALD), evaporation, reactive sputtering, chemical solution deposition or other similar deposition processes, and the gate dielectric layers may also be formed by the combination of any of the above processes.

When gate dielectric layers 404A and 404B are formed, a regular trapezoid gate conductor 406A and an inverted trapezoid gate conductor 406B are formed on the gate dielectric layers 404A and 404B, respectively, the gate conductors may include the conductive materials of any type, which include but are not limited to polysilicon, metal or metal alloy, silicide, conductive Nitride, poly-SiGe and their combinations. The materials of the NMOS gate conductor 404A and the PMOS gate conductor 404B may either be the same or not the same, preferably the materials are the same. Wherein, specifically, as for the manufacturing process of a traditional CMOS device or the gate-first process for the high-K dielectrics/metal gate, for example, a deposition process is used to form gate conductor layers 406A and 406B on the gate dielectric layers 404A and 404B, respectively, then a method of selective etching is used to form a regular trapezoid gate conductor structure and an inverted trapezoid gate conductor structure, as stated above, as for an NMOS, the angle $\alpha$ between its side and bottom is less than 90°, preferably $45°<\alpha<90°$; as for a PMOS, the angle $\alpha$ between its side and bottom, is larger than 90°, preferably $90°<\alpha<135°$. Then, through other common steps, for example, forming source/drain extensions 412A and 412B in the source/drain area, forming sources and drains 414A and 414B, forming an Interlayer Dielectric Layer (ILD) 416 on the top surface of the source and gate for contact, forming a metal contact 418, thereby forming the device as shown in FIG. 4. As for the gate-last process for the high-K dielectrics/metal gate, on the basis of the formation of the regular trapezoid polysilicon gate conductor structure and an inverted trapezoid polysilicon gate conductor structure as stated above, and upon formation of the stated source/drain extensions and the sources and drains described later, the gate conductors are removed, the gate dielectric layers 404A and 404B under the gate conductors may remain intact or substantially intact. However, the embodiments of the present invention are not limited to this, for example, according to some embodiments, the exposed parts of the gate dielectric layers 404A and 404B due to removal of the gate conductors may also be selectively removed, to thereby expose the channel regions below. In such a case, re-growth of the gate dielectric layers 404A and 404B is needed in the open gate regions. Then, for example, a deposition process is used to deposit a gate metal. Later, a metal contact 418 is formed, to thereby form the device as shown in FIG. 4. In any case, in order not to vague the essence of the present invention, those skilled in the art may refer to other documents and patents to know the details of these steps. Since the vacancy after removing the polysilicon is of a regular trapezoid or an inverted trapezoid shape, the formed metal gate is still of a regular trapezoid or an inverted trapezoid shape. In such a case, the gate can apply stresses to the channel in directions as indicated by the hollow arrows in FIG. 4, that is, introducing tensile stress in a direction along the channel, i.e., direction X and introducing compressive stress in a direction perpendicular to the channel direction, i.e., direction Z in the NMOS, thus the mobility of electrons in the channel is enhanced. While in a PMOS, introducing compressive stress in a direction along the channel, i.e., direction X, which also enhances the mobility of holes in the channel. Meanwhile, since the shape of the gate structure may be changed by controlling the process parameter simply, that is, controlling the angle $\alpha$, the degree of the channel strain may be controlled easily, greater process flexibility and simple process complexity are possessed with no additional process cost.

Alternatively, stress sidewalls 407A and 407B may be formed on both sides of the NMOS and/or PMOS gate conductor, such stress sidewalls 407A and 407B may be formed from either single-layer thin film (single process) or multi-layer thin film (multiple processes), such as $SiO_2$, Silicon Nitride, $SiO_2$/Silicon Nitride, the multi-layer structure of shift $SiO_2$ or Silicon Nitride and the conventional $SiO_2$ or Silicon Nitride, and the multi-layer structure of shift $SiO_2$ or Silicon Nitride and a first conventional $SiO_2$ or Nitride and a second conventional $SiO_2$ or Silicon Nitride and so on.

Alternatively, a stress source 408A, including the embedded SiC or the stress source of any type formed by any further techniques, may be embedded into source and drain areas adjacent to the NMOS gate conductor; a stress source 408B, including the embedded SiGe or the stress source of any type formed by any further techniques, may be embedded into source and drain areas adjacent to the PMOS gate conductor; or a stress source 408A is formed in the NMOS and a stress source 408B is formed in the PMOS.

Alternatively, a stress liner 410A may be formed on the top of the NMOS, and the stress liner may apply a stress to the channel region under the gate conductor; a stress liner 410B may also be formed on the top of the PMOS, and the stress liner may apply a stress to the channel region under the gate conductor; or a double-stress liner structure may be formed, that is, a stress liner 410A is formed on the top of the NMOS and a stress liner 410B may also be formed on the top of the PMOS. Wherein the stress liner is formed on the top of the NMOS or PMOS by deposition, for example, in a Plasma Enhanced Chemical Vapor Deposition (PECVD), but the stress liner may also be formed by other common methods except for PECVD. The stress liner may be nitride or oxide liner. However, it should be understood by those skilled in the art that the stress liner is not limited to nitride or oxide liner, other stress liner materials may also be used.

In a case where the NMOS device comprises the above stress sidewalls 407A, embedded stress source 408A or stress liner 410A, if the above gate is in a shape of a regular trapezoid with an angle $\alpha<90°$, the stress sidewalls 407A, embedded stress source 408A or stress liner 410A may either be tensile or be compressive, so long as the sum of the stress applied by the regular trapezoid gate conductor to the channel and the stress applied by the stress sidewalls, stress source, and stress liner to the channel makes the stress in the channel of the NMOS device be the tensile stress. However, in a case where at least one of the stress sidewalls 407A, embedded stress source 408A or stress liner 410A is a tensile stress source, the gate is not limited to a structure such as a regular trapezoid that is made to generate an enhanced tensile stress to the channel, it can even be an inverted trapezoid gate with $\alpha>90°$, only the gate then generates compressive stress to the channel, but one or all of the stress sidewalls 407A, embedded stress source 408A or stress liner 410A may generate tensile stress to the channel, so long as the total effect of the sum of the stress applied by the inverted trapezoid gate conductor to the channel and the stress applied by the stress sidewalls, stress source, and stress liner to the channel makes the stress in the channel of the NMOS device be the tensile stress, the result is that the carrier mobility of the NMOS device is still enhanced.

In a case where the PMOS area comprises the above stress sidewalls 407B, embedded stress source 408B or stress liner 410B, if the above gate is in a shape of an inverted trapezoid with an angle $\alpha>90°$, the stress sidewalls 407B, embedded stress source 408B or stress liner 410B may either be tensile or be compressive, so long as the sum of the stress applied by the inverted trapezoid gate conductor to the channel and the stress applied by the stress sidewalls, stress source, and stress liner to the channel makes the stress in the channel of the PMOS device be the compressive stress. However, in a case where at least one of the stress sidewalls 407B, embedded stress source 408B or stress liner 410B is a compressive stress source, the gate is not limited to a structure such as an inverted trapezoid that is made to generate an enhanced compressive stress to the channel, it can even be a regular trapezoid gate with α<90°, only the gate then generates tensile stress to the channel, but one or all of the stress sidewalls 407B, embedded stress source 408B or stress liner 410B may generate compressive stress to the channel, so long as the total effect of the sum of the stress applied by the regular trapezoid gate conductor to the channel and the stress applied by the stress sidewalls, stress source, and stress liner to the channel makes the stress in the channel of the PMOS device be the compressive stress, the result is that the carrier mobility of the PMOS device is still enhanced.

In addition, through this embodiment, it can be easily thought of by those skilled in the art that the shape of the gate is not limited to a regular trapezoid or an inverted trapezoid, but includes other shapes that can make the stress in the channel change, for example, the shape whose sides are not linear but have certain curvature (inward curving or outward curving).

The above gate shapes may be formed by using the selective etching as stated in embodiment 1, and no more details will be provided here.

In conclusion, the shape of the gate conductor may be adjusted by controlling the etching process parameter, thus the stress in the NMOS and PMOS channels may be adjusted conveniently, meanwhile, it may be used in combination with other mechanisms that generate stresses to obtain the desired channel stress.

The scope of the present invention includes any other embodiments and applications that may use the above structures and methods. Therefore, the scope of the present invention shall be determined by referring to the scope of the attached claims as well as the scope of the equivalents that are assigned with such claims.

What is claimed is:

1. An MOS device (200, 300), comprising:
   a semiconductor substrate (202, 302);
   a channel formed on the semiconductor substrate (202, 302);
   a gate dielectric layer (204, 304) formed on the channel;
   a gate conductor (206, 306) formed on the gate dielectric layer (204, 304); and
   a source and a drain formed on both sides of the gate;
   wherein the gate conductor (206, 306) has a shape in the form of a regular trapezoid if the MOS device is a NMOS device or an inverted trapezoid if the MOS device is a PMOS device, for adjust stress to be applied to the channel so as to adjust the mobility of carriers in the channel.

2. The MOS device of claim 1, further comprising at least one of stress sidewalls (207, 307) formed on both sides of the gate conductor for generating a second stress to be applied to the channel, a stress source (208, 308) embedded into the source and drain areas for generating a third stress to be applied to the channel, and a stress liner (210, 310) formed on the MOS device (200, 300) for generating a fourth stress to be applied to the channel such that the mobility of carriers in the channel of the MOS device is enhanced.

3. The MOS device of claim 2, wherein the MOS device is an NMOS device, the first stress produced by the gate conductor is tensile stress, and the second stress, the third stress, and the fourth stress are tensile stresses or compressive stresses, such that the sum of the first stress, the second stress, the third stress, and the fourth stress is adjusted to be tensile stress.

4. The MOS device of claim 3, wherein an angle α between side and bottom of the regular trapezoid satisfies $45°<a<90°$.

5. The MOS device of claim 4, wherein α satisfies $45°<a<85°$.

6. The MOS device of claim 5, wherein α satisfies $45°<a<75°$.

7. The MOS device of claim 1, the gate dielectric layer (204, 304) includes one of $SiO_2$, SiON, $ZrO_2$, $HfO_2$, $Al_2O_3$, HfSiO, HfAlO, HfSiON, HfAlSiO, HfTaSiO and/or combination thereof, and/or multi-layer structures thereof.

8. The MOS device of claim 1, the gate conductor includes one of polysilicon, metal or metal alloy, silicide, conductive Nitride, and poly-SiGe, or the combinations thereof.

9. The MOS device of claim 2, the stress sidewalls (207, 307) are formed of one of $SiO_2$, Silicon Nitride, $SiO_2$/Silicon Nitride, the multi-layer structure of shift $SiO_2$ or Silicon Nitride and the conventional $SiO_2$ or Silicon Nitride, and the multi-layer structure of shift $SiO_2$ or Silicon Nitride and a first conventional SiO2 or Nitride and a second conventional $SiO_2$ or Silicon Nitride.

10. The MOS device of claim 2, the stress source (208, 308) includes SiC or SiGe.

11. The MOS device of claim 2, the stress liner (210, 310) is nitride or oxide liner.

* * * * *